United States Patent
Lesea

(10) Patent No.: US 9,804,207 B1
(45) Date of Patent: Oct. 31, 2017

(54) INTERNAL VOLTAGE MONITORING FOR INTEGRATED CIRCUIT DEVICES

(71) Applicant: Xilinx, Inc., San Jose, CA (US)

(72) Inventor: Austin H. Lesea, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 77 days.

(21) Appl. No.: 15/058,014

(22) Filed: Mar. 1, 2016

(51) Int. Cl.
  *G01R 31/00* (2006.01)
  *G01R 31/3187* (2006.01)
  *G01R 19/252* (2006.01)
  *G01R 31/28* (2006.01)

(52) U.S. Cl.
  CPC ....... *G01R 19/252* (2013.01); *G01R 31/2832* (2013.01)

(58) Field of Classification Search
  CPC ............... G01R 31/40; G01R 31/2884; G01R 31/2832; G01R 31/3004; H03K 19/361; H03K 19/364; G01K 3/005; G01K 3/028; G01K 3/10; G01K 7/32; G01K 7/245; H02M 3/157; H02M 3/337
  See application file for complete search history.

(56) References Cited

U.S. PATENT DOCUMENTS 7,705,600 B1 * 4/2010 Byrkett ............. G01R 31/2884
324/416

OTHER PUBLICATIONS

Xilinx, Inc. "UltraScale Architecture System Monitor", User Guide UG580, v1.4, Jul. 11, 2015, 1-86 pp., San Jose, CA USA.

* cited by examiner

*Primary Examiner* — Minh N Tang
(74) *Attorney, Agent, or Firm* — LeRoy D. Maunu

(57) ABSTRACT

An integrated circuit (IC) is located on an IC chip and includes an integrated voltage regulator circuit that provides an internal supply voltage to the IC. A test mode signal can be received from an external pin of the IC chip. In response to the test mode signal, the IC can enter a test mode where the internal supply voltage is provided to components of the IC. Also in the test mode, voltage characteristics of the internal supply voltage are measured to produce an analog held value. The measurements occur in an analog domain and over a plurality of sample-and-hold windows. Upon completion of a measurement window, the analog held is converted to a digital value. The digital value is then stored in a memory circuit. The digital value is provided from the memory circuit to a reader device external to the IC.

20 Claims, 4 Drawing Sheets

INTERNAL VOLTAGE MONITORING FOR INTEGRATED CIRCUIT DEVICES

TECHNICAL FIELD

The disclosure generally relates to monitoring internal voltages, and more particularly to monitoring internally generated supply voltages using digital to analog converters.

BACKGROUND

There are a variety of different applications that can use memory circuits including, but not limited to, programmable logic devices (PLDs) and System on Chip (SoC) devices. Some SoC devices can include programmable logic that is similar to programmable logic provided by various PLDs. PLDs are a well-known type of programmable integrated circuit (IC) that can be programmed to perform specified logic functions. One type of PLD, the field programmable gate array (FPGA), can include an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay locked loops (DLLs), bus or network interfaces such as Peripheral Component Interconnect (PCI), PCI Express (PCIe) and Ethernet, and so forth. Some devices include enough components and functionality to effectively serve as an entire computer system on a single IC chip. Devices with such functionality are sometimes referred to as SoCs.

The power requirements of ICs, such as FPGAs and SoCs, can be difficult to meet as the size and speed of the devices increases. For example, a system designer who is using an FPGA in a design needs to satisfy the power requirements of the FPGA within the overall system. Satisfying power requirements of a system design can be complicated when the FPGA requires multiple different supply voltages for different purposes. Differences between the supply voltages may include recommended operating conditions, different amounts of current and other characteristics.

These and other problems can be problematic for IC design and their use.

SUMMARY

A number of implementations are directed toward a method for testing an integrated circuit (IC) located on an IC chip and that includes an integrated voltage regulator circuit that provides an internal supply voltage to the IC. A test mode signal can be received from an external pin of the IC chip. In response to the test mode signal, the IC can enter a test mode. In the test mode, the internal supply voltage is provided to components of the IC. Also in the test mode, a voltage characteristic of the internal supply voltage is measured to produce an analog held value. The measurement occurs in an analog domain and over a plurality of sample-and-hold windows that are part of a measurement window. Upon completion of the measurement window, the analog held value representative of the measured voltage characteristics during the measurement window is converted to a digital value. The digital value is then stored in a memory circuit of the IC. The digital values are provided from the memory circuit to a reader device external to the IC.

Certain implementations are directed toward a system that includes an integrated circuit (IC) chip. The IC chip includes an integrated voltage regulator circuit that is configured to provide an internal supply voltage to the IC chip. A test control interface is configured to receive a test mode signal from an external pin of the IC chip; and to write, in response to the test mode signal, a value to a test mode register. An analog to digital converter (ADC) circuit is configured to, in response to the value written to the test mode register: measure, in an analog domain and over a plurality of sample-and-hold windows that are part of a measurement window, a voltage characteristic of the internal supply voltage to produce an analog held value; and convert, upon completion of the measurement window, the analog held value to a digital value. A memory circuit and memory interface circuit are configured to: store the digital value in the memory circuit; and provide the digital value from the memory circuit to a reader device external to the IC chip.

Various implementations are directed toward a system that includes an integrated circuit (IC) chip with an integrated voltage regulator circuit that is configured to provide an internal supply voltage to the IC chip. The IC chip includes a test control interface that is configured to receive a test mode signal from an external pin of the IC chip; and write, in response to the test mode signal, a value to a test mode register. An analog to digital converter (ADC) circuit can be configured to, in response to the value written to the test mode register, detect a peak voltage of the internal supply voltage and a minimum voltage of the internal supply voltage. The ADC circuit can also be configured to determine an average voltage of the internal supply voltage. A memory circuit and memory interface circuit can be configured to store values representing the determined peak voltage, minimum voltage, and average voltage; and provide the stored voltages from the memory circuit to a reader device external to the IC chip.

Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

Figure 1:
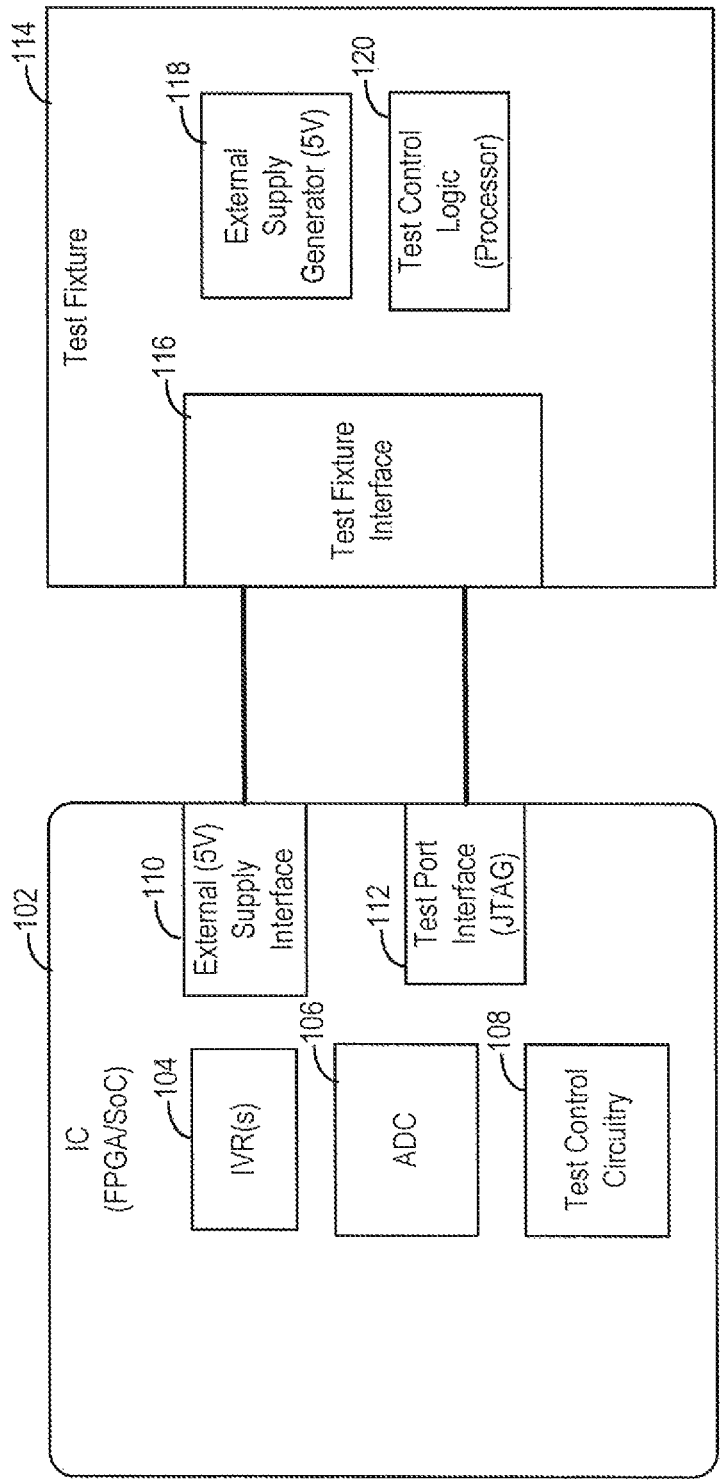
FIG. 1 depicts a block diagram for a system designed to test an IC chip with an integrated voltage regulator circuit, consistent with implementations of the present disclosure.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed toward a method for testing an IC chip (or simply "IC") that includes an integrated voltage regulator circuit, which provides an internal supply voltage to the IC. The use of an integrated voltage regulator circuit can be beneficial in that a system designer does not need to provide the equivalent regulation as an external part of the system. Moreover, the constraints on the supply voltage that is provided can generally be relaxed based upon the capabilities of the internal voltage regulator circuit to handle different input voltage characteristics and conditions. For ICs such as FPGAs and SoCs, the number of external connections (pins) that are available for use for input/output can be a limiting factor in the capabilities of the IC. When an internal voltage regulator circuit is used, pins that would otherwise be used for providing supply voltage can be used for other (e.g., input/output) purposes. An unintended effect of changing the use for the pins is that the corresponding supply voltage is no longer easily accessible to external testing equipment. As such, it can become difficult to properly test the IC during the manufacturing process. Various implementations allow for such testing using an internal analog-to-digital converter (ADC) circuit that monitors the voltage produced by the integrated voltage regulator circuit.

According to certain implementations, the IC can be configured to enter a test mode during which the internal supply voltage can be monitored. This can be in response to receiving a test mode signal from a test control interface that includes an external pin of the IC (e.g., through a Joint Test Action Group (JTAG) interface). While in the test mode, the IC can power the various internal components using the internal supply voltage. For instance, the configurable logic blocks, memory, I/O blocks and other functions can be powered. Consistent with various implementations, the test mode can enable the ADC circuit to take various measurements of the internal supply voltage. The internal measurements can include measurements for voltage characteristics that capture transients, such as the peak and minimum voltage of the internal supply voltage, as well as the nominal voltage (e.g., using an averaging). The values for the internal measurements can be stored in a memory circuit that is accessible by an external reader device using a corresponding memory interface circuit. For example, the ADC can store values for the internal measurements in registers that are accessible through JTAG or similar test ports.

According to some implementations, the internal measurements from the ADC can be used as part of a feedback loop that adjusts the functional operation of the integrated voltage regulator circuit. This can include adjusting various components and settings as part of a trimming operation. For instance, the values of a voltage reference, resistive components, and capacitive components can each be adjusted to change the operation of the integrated voltage regulator circuit. For example, a trimmable resistor network can include a set of switches that allow for different combinations of resistors to be enabled, thereby providing different effective resistance. The trimming process can be repeated until the integrated voltage regulator circuit is within acceptable parameters. In some instances, this adjustment can be fixed (made permanent) by, for example, blowing e-fuses or writing to write once non-volatile memory.

Turning now to the figures, FIG. 1 depicts a block diagram for a system designed to test an IC chip with an integrated voltage regulator circuit, consistent with implementations of the present disclosure. The system includes both the IC chip 102 being tested and the test fixture 114 that is performing the testing. As discussed herein the IC 102 can be a programmable IC chip with configurable logic blocks, such as an FPGA or SoC. Moreover, the IC 102 can include one or more integrated voltage regulators (IVRs) 104. Each of the IVRs 104 can be configured to be powered from one or more external supply voltages and to produce a regulated voltage for use by components internal to the IC 102. The test fixture 114 and IC 102 can be configured to allow for various different components and functions of the IC 102 to be tested as part of a test procedure for the IC manufacturing process. For instance, the test fixture 114 can include a bed of nails, clam shell, or similar physical interface for connecting to the various pins of the IC 102. Using these connections, the test fixture 114 can monitor signals on the corresponding pins and also can provide test signals.

The test fixture 114 can include an external supply generator 118 that is configured to generate a supply voltage (e.g., 5V) that is provided to the IC 102 using test fixture control interface 116 and external supply interface 110. The IVRs 104 use the external supply voltage to generate regulated voltages for use by the IC. According to various implementations the regulated voltage(s) can be considered internal to the IC in that the test fixture 114 does not have direct access to the regulated voltages through an external pin or similar connection point. Thus, the physical interface of the test fixture does not include connection points, or connection nodes, that provide the regulated voltages for direct measurement by the test fixture. This inability to directly measure the regulated voltages can create issues with fully testing the IC because the regulated voltages are not directly measurable for the purposes of detecting and diagnosing problems with ICs. For instance, if the regulated voltages were directly observable by the test fixture 114, then the test fixture 114 could use monitoring circuitry to precisely measure and quantify the properties of the regulated voltages. This monitoring circuitry can be relatively expensive and precise as it is part of a single test fixture (e.g., as opposed to part of each IC).

Consistent with various implementations, the IC 102 can include one or more internal ADCs 106 that are configured to monitor and report on the regulated voltages as part of a test procedure. The test fixture interface 116 can include test control logic 120 that is configured to transmit a test mode signal to the test port interface 112 of the IC 102. This can be accomplished using a Joint Test Action Group (JTAG) compliant port, interface, and protocol, for example. The IC can include test control circuitry 108 that receives the test mode signal and configures the ADCs 106 to monitor the regulated voltages. The results of the monitoring can be stored in a local memory circuit that is accessible through the test port interface 112, which can serve as a memory interface circuit.

According to certain implementations, the ADCs 106 can be configured for use by the IC 102 apart from the test mode and corresponding monitoring of the regulated voltages. For instance, the IC 102 can be a programmable IC that can be configured by the end users for a variety of different end uses. The ADCs 106 can be used to monitor various input pins depending upon the particular design. Moreover, the ADCs 106 can be configured to monitor signals and sensors that are internal to the IC 102. This can include monitoring temperature sensors within the IC, for example. According to various implementations, the ADCs 106 can include one or more multiplexers that are configured to allow for selection between different inputs to the corresponding ADC.

In some implementations, the ADCs 106 can be configured to provide a sample-and-hold function that is used to measure and detect voltage characteristics, such as minimum and maximum (peak) values, for the regulated voltages. For example, a sample-and-hold circuit can be used along with a comparison circuit so that the ADC can hold its current analog value unless the presently measured value is higher (for peak detection) or lower (for minimum detection) than the analog held value. The use of a sample-and-hold circuit can be particularly useful for providing accurate measurement of fast transients on the regulated voltage. For instance, the ADC produces a single digital output value over a measurement window during which multiple measurements can be taken in the analog domain.

For a peak or minimum voltage detection, each newly-generated analog held value can be compared to the analog held value from a prior sample-and-hold window. The comparison can be used to determine whether to replace the prior analog held value with the newly-generated analog held value, or to leave the prior analog held value. For example, a peak detection can operate by replacing the prior analog held value upon determining that the newly-generated analog held value is greater than the prior analog held value. The comparator circuit for this function can be designed to operate in the analog domain at high speed, allowing for the ADC to have a relatively high effective resolution over the measurement window (e.g., by decoupling each individual analog measurement from the digitization of the measured analog value). Once the measurement window has ended, the analog held value on the ADC represents the voltage characteristic for the measurement window and can then be converted to a digital value and stored in a memory circuit. In particular applications, such a circuit can provide a resolution of about 1 nanosecond or less for transients occurring during each of the sample-and-hold windows, which can catch correspondingly short transients on the regulated voltage.

According to various implementations, the ADCs 106 can include an averaging circuit that is configured to provide an averaging function that operates in the analog domain. The averaging circuit can be configured to operate in the analog domain at high speed, allowing for the ADC to have a relatively high effective resolution over the measurement window. Once the measurement window has ended, the average value on the ADC can then be converted to a digital value and stored in a memory circuit.

Figure 2:
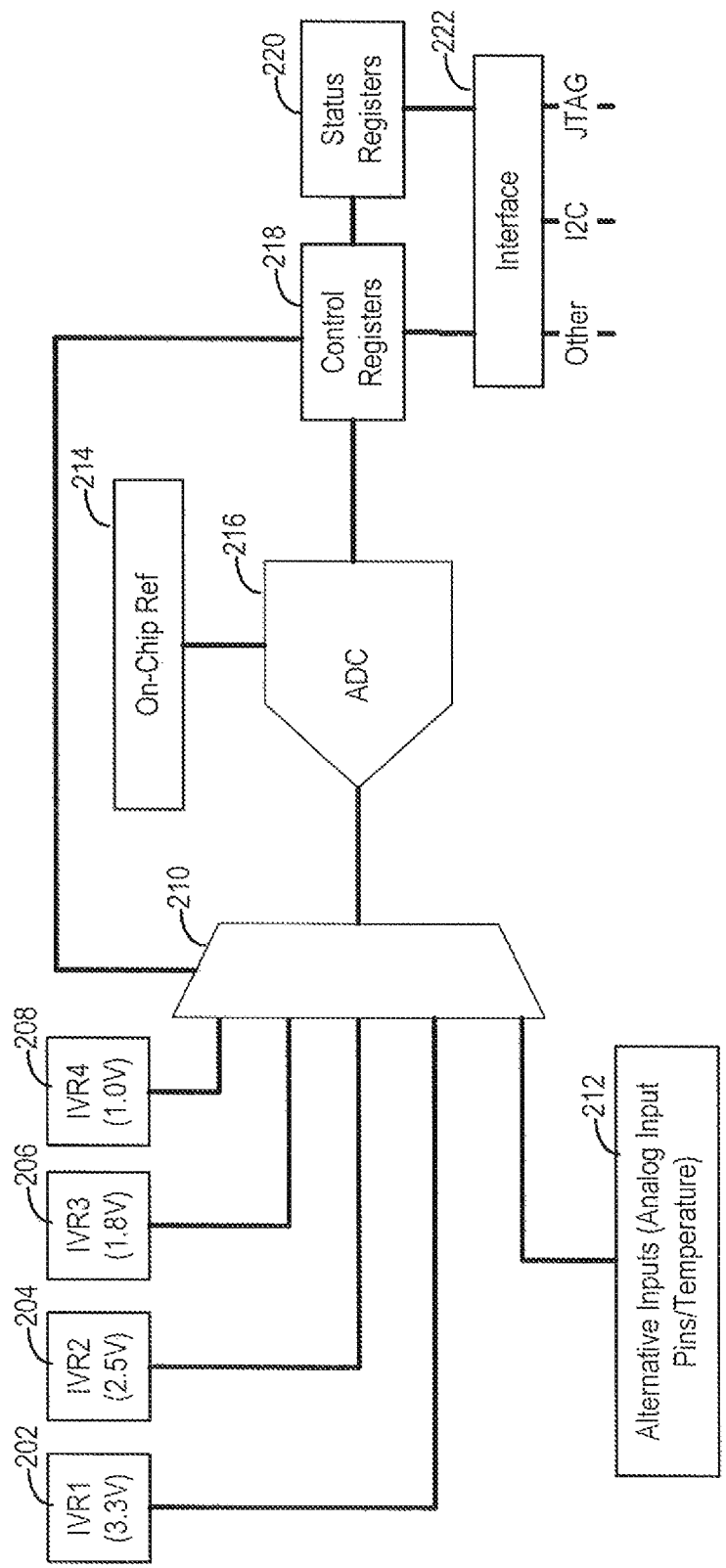
FIG. 2 depicts a block diagram that includes an ADC for measuring internal voltage regulators (IVRs), consistent with various implementations of the present disclosure.

FIG. 2 depicts a block diagram that includes an ADC for measuring internal voltage regulators (IVRs), consistent with various implementations of the present disclosure. ADC 216 can be configured to provide a digital representation of measured analog inputs that are provided by a multiplexer circuit 210. Multiplexer circuit 210 can be configured to select between various different signal sources including external input/output pins for use in receiving signals from external sources during normal operation of the IC. In certain implementations, the selection can be controlled by a test mode register, which can be a part of a set of control registers 218. For example, an external test fixture can access the control registers 218 through interface 222 in order to provide a test mode signal. In a particular example, the test mode signal is generated by writing a value to a particular configuration register, which is referred to as the test mode register herein. In response, the multiplexer can select regulated voltages that are generated one of the IVRs 202, 204, 206, or 208. The IVRs can be configured to provide a variety of different voltages (e.g., 3.3V, 2.5V, 1.8V, and 1.0V), and can each have different acceptable operational parameters (e.g., acceptable min/max/average voltages). ADC 216 can then be configured to measure particular aspects of the regulated voltages. The measured values can be stored in a memory circuit, such as in test mode (status) registers 220. The measured aspects can include voltage characteristics discussed herein, which can include the peak, minimum, and average voltages. An on-chip reference voltage generator circuit 214 can be used by the ADC 216 to provide an accurate reference point. For instance, a bandgap reference generator circuit could be used to provide a stable and accurate reference voltage.

Consistent with various implementations, the ADC 216 can be configured to operate in different modes in order to capture corresponding aspects of the regulated voltages. Moreover, the different modes can be maintained for a desired time window. In some implementations, the time window can be predetermined, while other implementations allow for the time window to be set by the test fixture. For example, the test fixture can write a value to the configuration registers that places the ADC into a test mode, selects one of the IVRs, selects an aspect to measure (e.g., peak voltage), and indicates a desired time window during which the measurement is taken. Once the time window is completed and the test fixture has retrieved the corresponding data, the test fixture can update the configuration registers to select a different voltage characteristic (or other aspect) to measure (e.g., average voltage), a different regulated voltage supply to measure, or both.

In some implementations, the configuration registers can also be used to select between various alternative inputs 212 when not operating in the test mode. This allows the ADC to be used for a number of different purposes by the programmer (end user) of the IC.

Figure 3:
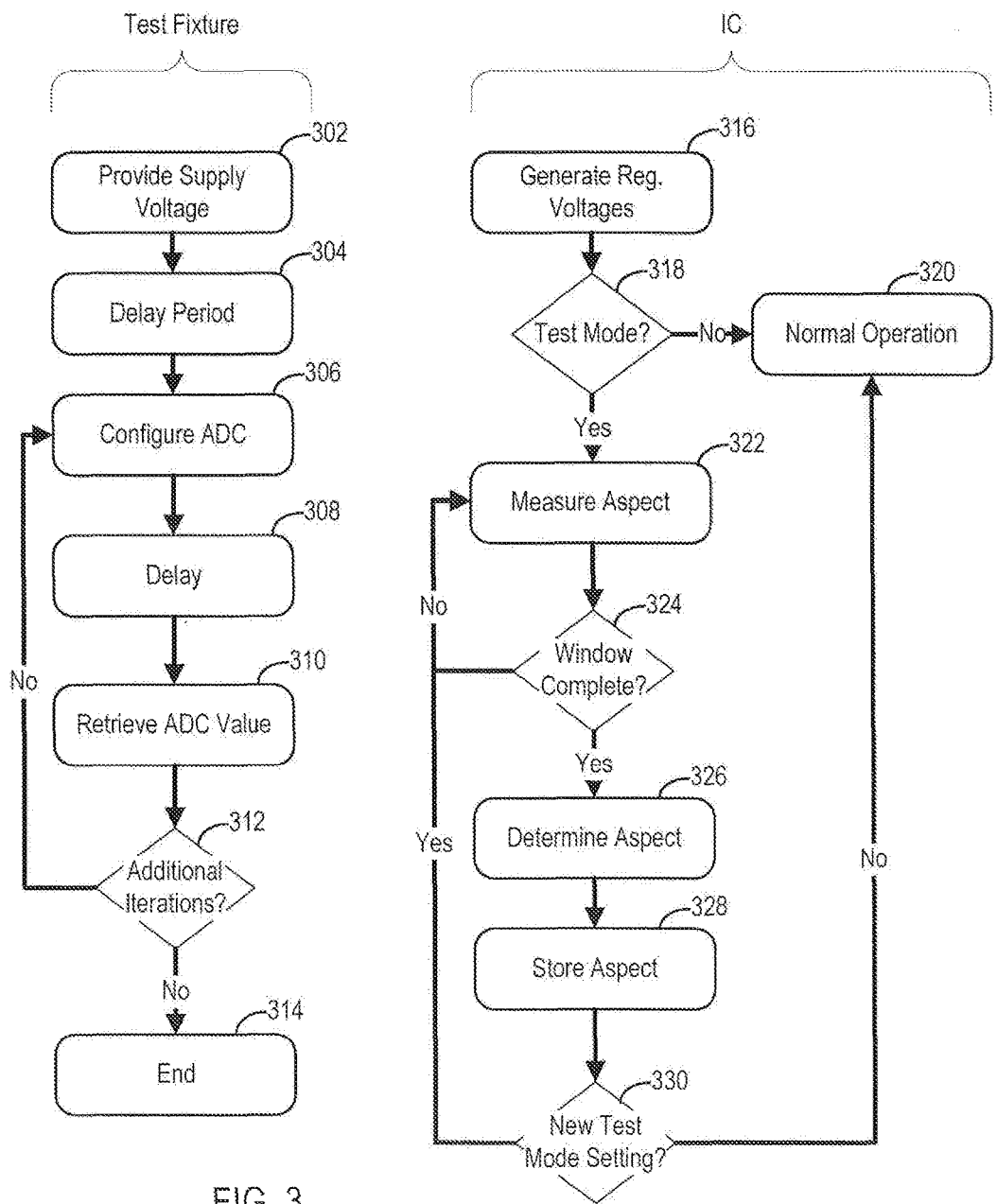
FIG. 3 depicts a flow diagram for operating the IC in a test mode while monitoring aspects of internally regulated voltages, consistent with various implementations of the present disclosure.

FIG. 3 depicts a flow diagram for operating the IC in a test mode while monitoring aspects of internally regulated voltages, consistent with various implementations of the present disclosure. The blocks 302-314 represent functions that can be carried out by the test fixture, while blocks 316-330 represent functions that can be carried out by an IC that is in the test fixture. Once an IC is placed in the test fixture, the test fixture can provide an external supply voltage (e.g., 5V), per block 302. In response to receiving the external supply voltage, the IC can begin generating the internal regulated voltages, per block 316. Consistent with various implementations, the test fixture can be configured to delay for a period of time that is sufficient for the IC to produce stable regulated internal voltages, as shown by block 304. This delay can be a set time that is consistent with the expected (or maximum accepted) time for the IVRs to reach steady state conditions. In some instances, the delay can be based upon the IC providing an indication that the regulated internal voltages are stable (e.g., by setting a flag/bit in status registers or toggling an input/output pin).

The test fixture can then use a connection to an external pin of the IC to provide a test mode signal and configure the ADC, per block 306. For instance, the test fixture can use a JTAG interface to write to one or more configuration registers of the ADC. The IC can be configured to determine whether or not test mode is indicated, per block 318. If not, then the IC can proceed with a normal operational mode, per block 320. The normal operational mode can correspond to use in the field by the end user. If test mode is indicated and entered, then the ADC can be configured to detect and measure a desired aspect of the IC, per block 322. For example, the ADC might be configured to measure voltage characteristics for a particular regulated voltage, such as the voltage peak. The IC can then detect the peak by taking a plurality of sample-and-hold measurements in the analog domain and during a desired time (or measurement) window, as determined in block 324. The length of the time window can be specified in the configuration registers by the test fixture or a default time, depending upon the particular implementation. Once the time window is complete, the IC can determine the digital value for the desired aspect, per block 326. This can include digitizing an analog value detected by the ADC (e.g., an analog value that is held by the ADC and that represents the peak, minimum, or an average value). The determined digital value can then be stored in a memory circuit, per block 328.

According to various implementations, the regulated internal voltage being monitored can be provided to components of the IC while it is being monitored by the ADC. This can be particularly useful for detecting potential problems with the components, or with insufficient current providing capabilities of an IVR. Moreover, the test fixture and IC can be designed to implement one or more test procedures during the monitoring time window (e.g., to vary the current draw and to test different components that draw power from the regulated internal voltage).

Consistent with certain implementations, the test fixture is configured to delay until the time window is complete, per block 308. The time period for the delay can be separately measured by the test fixture, in response to an indication from the IC, or both. For instance, the test fixture could end the delay upon the earlier of a receipt of an indication from the IC or a timeout/watchdog counter event. Upon completion of the delay, the test fixture can be configured to function as an external reader device that accesses the stored value from the memory circuit of the IC, per block 310.

According to some implementations, the test fixture can be designed to configure the IC to perform multiple iterations of the measurement and determination cycle, as shown by the decision blocks 312 and 330. For instance, the same aspect (e.g., average voltage) can be measured repeatedly as part of a trimming process during which the operational characteristics/parameters of the corresponding IVR are adjusted until the aspect falls within an acceptable threshold of values. In other instances, the iterations can correspond to different aspects (e.g., peak voltage, minimum voltage, and average voltage) for the same IVR. Still instances allow for iterations to be performed for different IVRs. Combinations of these instances are also possible. If no more iterations are to be undertaken, the testing can end, per blocks 314 and 320.

Figure 4:
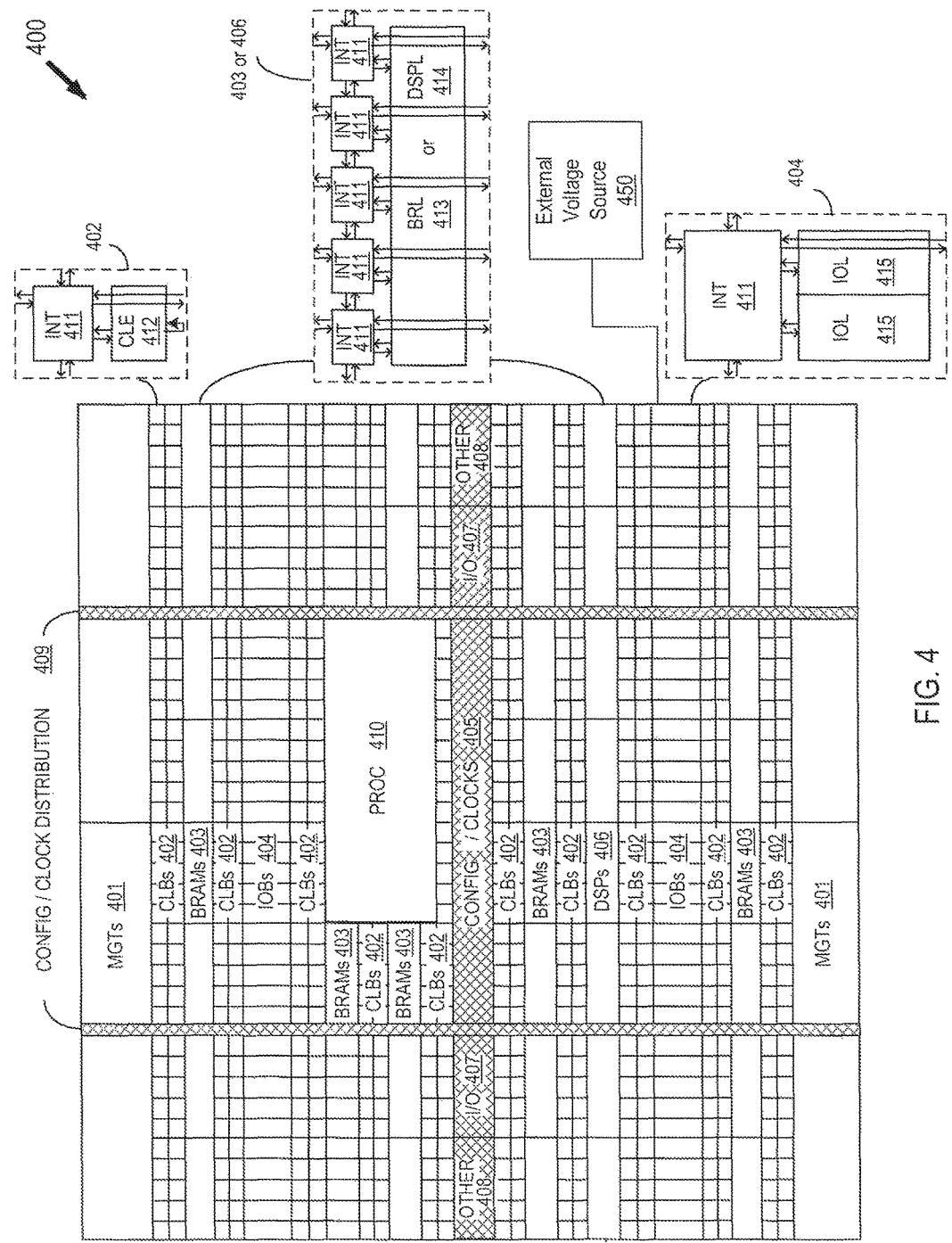
FIG. 4 shows an example of a device for which internal voltage regulators can be tested using an internal analog-to-digital converter circuit, consistent with implementations of the present disclosure.

FIG. 4 shows an example of a device for which internal voltage regulators can be tested using an internal analog-to-digital converter circuit, consistent with implementations of the present disclosure. Though a programmable IC is described, those skilled in the art will recognize that the disclosed methods and systems may be applied to circuit designs that target application specific integrated circuits (ASICs) and are not limited to programmable ICs. The programmable IC 400 may be referred to as a System On Chip (SOC) that includes field programmable gate array logic (FPGA) along with other programmable resources. FPGA logic may include several different types of programmable logic blocks in the array. For example, FIG. 4 illustrates programmable IC 400 that includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (I/O) 407, for example, clock ports, and other programmable logic 408 such as digital clock managers, analog-to-digital converters, system monitoring logic, and so forth. Some programmable IC having FPGA logic also include dedicated processor blocks (PROC) 410 and internal and external reconfiguration ports (not shown).

The IVRs can generate power for various components including memory circuits such as the BRAMs 403 of the programmable IC. In one implementation, an external voltage source 450 may be coupled to the IVRs to provide power thereto. The external voltage source can be part of a test fixture during the manufacturing process. During use by an end user, the voltage source can be provided by an IC die that is separate from the IC die on which the programmable IC is disposed.

In some implementations of FPGA logic, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA logic. The programmable interconnect element INT 411 also includes the connections to and from the programmable logic element within the same tile, as shown by the examples included at the top of FIG. 4.

For example, a CLB 402 can include a configurable logic element (CLE) 412 that can be programmed to implement user logic, plus a single programmable interconnect element INT 411. A BRAM 403 can include a BRAM logic element (BRL) 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL) 414 in addition to an appropriate number of programmable interconnect elements. An 10B 404 can include, for example, two instances of an input/output logic element (IOL) 415 in addition to one instance of the programmable interconnect element INT 411. As will be clear to those of skill in the art, the actual I/O bond pads connected, for example, to the I/O logic element 415, are manufactured using metal layered above the various illustrated logic blocks, and typically are not confined to the area of the input/output logic element 415. The different elements might use a corresponding and different internal regulated voltage, depending upon the particular configuration of the programmable IC.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 4 include additional logic blocks that disrupt the regular columnar structure making up a large part of the programmable IC. The additional logic blocks can be programmable blocks and/or dedicated logic. For example, the processor block PROC 410 shown in FIG. 4 spans several columns of CLBs and BRAMs.

Note that FIG. 4 is intended to illustrate only a non-limiting example of a programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 4 are merely one example. For example, in an actual programmable IC, more than one adjacent column of CLBs can be included wherever the CLBs appear, to facilitate the efficient implementation of user logic.

For the various flow diagrams depicted herein, the particular orders of the blocks and associated functions are provided as examples. The ordering is not necessarily limiting and can be varied according to various implementations.

Those skilled in the art will appreciate that various alternative computing arrangements, including one or more processors and a memory arrangement configured with program code, would be suitable for hosting the processes and data structures that may carry out functions disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use RAM circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. A method for testing an integrated circuit (IC) located on an IC chip and that includes an integrated voltage regulator circuit that provides an internal supply voltage to the IC, the method comprising:
   receiving a test mode signal from an external pin of the IC chip;
   entering, in response to the test mode signal, a test mode;
   in the test mode:
      providing the internal supply voltage to components of the IC;
      measuring, in an analog domain and over a plurality of sample-and-hold windows that are part of a measurement window, a voltage characteristic of the internal supply voltage to produce an analog held value;
      converting, upon completion of the measurement window, the analog held value to a digital value;
      storing the digital value in a memory circuit of the IC; and
      providing the digital values from the memory circuit to a reader device external to the IC.

2. The method of claim 1, wherein each of the sample-and-hold windows have a resolution of 1 nanosecond or less.

3. The method of claim 1, wherein the analog held value represents a voltage characteristic that is selected from the group consisting of a minimum voltage of the internal supply voltage, a peak voltage of the internal supply voltage, and an average voltage of the internal supply voltage.

4. The method of claim 1, wherein the IC includes programmable logic.

5. The method of claim 1, further comprising trimming, in response to the stored digital value in the memory circuit, values for components that result in a modification to operational characteristics of the integrated voltage regulator circuit.

6. The method of claim 5, wherein the components include resistive and capacitive components.

7. The method of claim 5, further comprising blowing fuses to fix the values for the components.

8. The method of claim 1, wherein the measuring voltage characteristics of the internal supply voltage includes:
   using a comparator circuit to compare a measured value from a current sample-and-hold window to a measured value from a prior sample-and-hold window, and
   replacing, in response to the comparison, the value from the prior sample-and-hold window with the value from the current sample-and-hold window.

9. The method of claim 1, further comprising iteratively repeating the measuring and converting, and wherein, during each iteration, values for components within the IC are trimmed to modify to operational characteristics of the integrated voltage regulator circuit.

10. A system comprising:
    an integrated circuit (IC) chip that includes:
       an integrated voltage regulator circuit that is configured to provide an internal supply voltage to the IC chip;
       a test control interface that is configured to:
          receive a test mode signal from an external pin of the IC chip; and
          write, in response to the test mode signal, a value to a test mode register;
       an analog to digital converter (ADC) circuit that, in response to the value written to the test mode register, is configured to:
          measure, in an analog domain and over a plurality of sample-and-hold windows that are part of a measurement window, voltage characteristics of the internal supply voltage to produce an analog held value; and
          convert, upon completion of the measurement window, the analog held value to a digital value; and
       a memory circuit and memory interface circuit that are configured to:
          store the digital value in the memory circuit; and
          provide the digital value from the memory circuit to a reader device external to the IC chip.

11. The system of claim 10, wherein the sample-and-hold windows have a resolution of one nanosecond or less.

12. The system of claim 10, wherein the held value represents a voltage characteristic that is selected from the group consisting of a minimum voltage of the internal supply voltage, a peak voltage of the internal supply voltage, and an average voltage of the internal supply voltage.

13. The system of claim 10, wherein the IC chip includes programmable logic.

14. The system of claim 10, wherein the IC chip is further configured to trim, in response to the digital value in the memory circuit, values for components that result in a modification to operational characteristics of the integrated voltage regulator circuit.

15. The system of claim 14, wherein the components include resistive and capacitive components.

16. The system of claim 14, wherein the IC chip includes fuses that are designed to fix the values for components.

17. The system of claim 10, further comprising a multiplexer that is configured to select between different inputs to the ADC circuit.

18. The system of claim 17, wherein the different inputs to the ADC circuit include another internal supply voltage provided by another integrated voltage regulator circuit of the IC chip.

19. The system of claim 18, wherein the different inputs to the ADC circuit include external pins of the IC chip.

20. A system comprising:
   an integrated circuit (IC) chip that includes:
      an integrated voltage regulator circuit that is configured to provide an internal supply voltage to the IC chip;
      a test control interface that is configured to:
         receive a test mode signal from an external pin of the IC chip; and
         write, in response to the test mode signal, a value to a test mode register;
      an analog to digital converter (ADC) circuit that, in response to the value written to the test mode register, is configured to:
         detect a peak voltage of the internal supply voltage;
         detect a minimum voltage of the internal supply voltage; and
         determine an average voltage of the internal supply voltage; and
      a memory circuit and memory interface circuit that are configured to:
         store values representing the determined peak voltage, minimum voltage, and average voltage; and
         provide the stored voltages from the memory circuit to a reader device external to the IC chip.

\* \* \* \* \*